(12) United States Patent
Yu et al.

(10) Patent No.: US 12,379,633 B2
(45) Date of Patent: Aug. 5, 2025

(54) DISPLAY PANEL AND DISPLAY TERMINAL

(71) Applicant: WUHAN CHINA STAR OPTOELECTRONICS TECHNOLOGY CO., LTD., Hubei (CN)

(72) Inventors: Wenqiang Yu, Hubei (CN); Chao Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 317 days.

(21) Appl. No.: 17/802,952

(22) PCT Filed: Aug. 15, 2022

(86) PCT No.: PCT/CN2022/112519
§ 371 (c)(1),
(2) Date: Aug. 28, 2022

(87) PCT Pub. No.: WO2024/000753
PCT Pub. Date: Jan. 4, 2024

(65) Prior Publication Data
US 2024/0004249 A1    Jan. 4, 2024

(30) Foreign Application Priority Data
Jul. 1, 2022 (CN) .......................... 202210775484.1

(51) Int. Cl.
*G02F 1/1362* (2006.01)
*G02F 1/1368* (2006.01)
(Continued)

(52) U.S. Cl.
CPC .. *G02F 1/136286* (2013.01); *G02F 1/136227* (2013.01); *G02F 1/1368* (2013.01);
(Continued)

(58) Field of Classification Search
CPC ...................................................... G02F 1/1362
See application file for complete search history.

(56) References Cited

U.S. PATENT DOCUMENTS

2014/0375917 A1* 12/2014 Kim .................. G02F 1/136213
349/39
2016/0190224 A1* 6/2016 Kim .................. H01L 29/41733
438/23
(Continued)

FOREIGN PATENT DOCUMENTS

CN    103762245 A    4/2014
CN    105045425 A    11/2015
(Continued)

OTHER PUBLICATIONS

International Search Report in International application No. PCT/CN2022/112519, mailed on Oct. 25, 2022.
(Continued)

*Primary Examiner* — Richard H Kim
(74) *Attorney, Agent, or Firm* — Rivka Friedman

(57) ABSTRACT

A display panel and a display terminal are provided. The display panel includes a substrate, a first metal layer disposed on the substrate, and a second metal layer disposed above the first metal layer. The first metal layer includes a plurality of data lines extending in a first direction and thin-film transistors each including a source electrode. The source electrode is electrically connected to a corresponding one of the data lines. The second metal layer includes a drain electrode of the thin-film transistor, and the drain electrode is located between adjacent ones of the data lines.

20 Claims, 4 Drawing Sheets

(51) Int. Cl.
*H10D 86/40* (2025.01)
*H10D 86/60* (2025.01)
(52) U.S. Cl.
CPC ......... *H10D 86/443* (2025.01); *H10D 86/481* (2025.01); *H10D 86/60* (2025.01)

(56) References Cited

U.S. PATENT DOCUMENTS

| | | | |
|---|---|---|---|
| 2016/0329390 A1 | 11/2016 | Ono | |
| 2017/0293172 A1* | 10/2017 | Zhang | G02F 1/136209 |
| 2018/0097117 A1* | 4/2018 | Hu | G02F 1/1368 |
| 2018/0348584 A1 | 12/2018 | Wu | |
| 2019/0386028 A1* | 12/2019 | Hong | H01L 27/124 |
| 2021/0356824 A1* | 11/2021 | Li | G02F 1/1368 |
| 2022/0028963 A1 | 1/2022 | Lee et al. | |
| 2022/0157923 A1* | 5/2022 | Zhao | H10K 59/124 |

FOREIGN PATENT DOCUMENTS

| | | | | |
|---|---|---|---|---|
| CN | 106158882 | * | 11/2016 | ......... G02F 1/1362 |
| CN | 106158882 A | | 11/2016 | |
| CN | 106684101 A | | 5/2017 | |
| CN | 107490917 A | | 12/2017 | |
| CN | 109061971 A | | 12/2018 | |
| CN | 110112186 | * | 8/2019 | ............... G09F 9/30 |
| CN | 110112186 A | | 8/2019 | |
| CN | 110941123 A | | 3/2020 | |
| CN | 111415969 A | | 7/2020 | |
| CN | 111708203 A | | 9/2020 | |
| CN | 112965310 A | | 6/2021 | |
| CN | 114695386 A | | 7/2022 | |
| CN | 114823736 A | | 7/2022 | |
| JP | 2008249975 A | | 10/2008 | |
| JP | 2011009490 A | | 1/2011 | |
| JP | 2017142312 | * | 8/2017 | ........... G02F 1/1368 |
| JP | 2019040026 A | | 3/2019 | |
| KR | 20130068558 A | | 6/2013 | |
| KR | 20150060195 A | | 6/2015 | |
| KR | 20200101966 A | | 8/2020 | |
| WO | 2015107606 A1 | | 7/2015 | |

OTHER PUBLICATIONS

Written Opinion of the International Search Authority in International application No. PCT/CN2022/112519, mailed on Oct. 25, 2022.
Chinese Office Action issued in corresponding Chinese Patent Application No. 202210775484.1 dated Apr. 12, 2023, pp. 1-7.
Russian Office Action issued in corresponding Russian Patent Application No. 202293132 dated Apr. 10, 2023, pp. 1-1.
Korean Office Action issued in corresponding Korean Patent Application No. 10-2022-7036460 dated Jul. 13, 2024, pp. 1-6.
Japanese Office Action issued in corresponding Japanese Patent Application No. 12022-550712 dated Aug. 20, 2024, pp. 1-3.

* cited by examiner

DISPLAY PANEL AND DISPLAY TERMINAL

BACKGROUND OF INVENTION

1. Field of Invention

The present application relates to a technical field of displays, and particularly to a display panel and a display terminal.

2. Related Art

Various types of display panels have been widely used in display screens of mobile phones, computers, augmented reality (AR), virtual reality (VR), and the like. Current three-dimensional displays are mainly based on sacrificing resolution to achieve the purpose of different content viewed by left and right eyes, requiring higher and higher resolutions.

However, current layout space and process capabilities of pixels limit improvement of the resolution, and especially the resolution of liquid crystal display panels is greatly limited, making it difficult to improve the resolution of current display panels.

SUMMARY OF INVENTION

Embodiments of the present application provide a display panel and a display terminal to solve a problem that resolution of current display panels is difficult to increase.

An embodiment of the present application provides a display panel, including a substrate, a first metal layer disposed on the substrate, and a second metal layer disposed above the first metal layer. The first metal layer includes a plurality of data lines extending in a first direction and thin-film transistors each including a source electrode, the source electrode is electrically connected to a corresponding one of the data lines, the second metal layer includes a drain electrode included in each of the thin-film transistors, and the drain electrode is located between adjacent ones of the data lines.

Optionally, in some embodiments of the present application, the display panel further includes a third metal layer disposed between the substrate and the first metal layer, and a semiconductor layer disposed between the first metal layer and the substrate. The third metal layer includes a plurality scan lines extending in a second direction, and the semiconductor layer includes a plurality of active elements of the thin-film transistors. Each of the active elements includes a source terminal, a drain terminal, and an active connecting member connected between the source terminal and the drain terminal, and the first direction is different from the second direction. The source terminal and the drain terminal are located on two sides of a corresponding one of the scan lines, respectively, the active connecting member extends at least in a third direction, and the third direction is different from the first direction and the second direction. The source electrode is electrically connected to the source terminal, and the drain electrode is electrically connected to the drain terminal.

Optionally, in some embodiments of the present application, the thin-film transistor includes a single gate structure.

Optionally, in some embodiments of the present application, an angle α between the third direction Z and the first direction X is greater than or equal to 5 degrees and less than or equal to 15 degrees.

Optionally, in some embodiments of the present application, the angle α between the third direction Z and the first direction X is 7 degrees.

Optionally, in some embodiments of the present application, the display panel includes a plurality of sub-pixels including a first sub-pixel and a second sub-pixel disposed on opposite sides of the scan line, and a gap is located between the pixel electrode of the first sub-pixel and the pixel electrode of the second sub-pixel. The gap is situated corresponding to the scan line.

Optionally, in some embodiments of the present application, the display panel further includes a gate insulating layer disposed between the semiconductor layer and the third metal layer, a first insulating layer disposed between the third metal layer and the first metal layer, and a second insulating layer disposed between the first metal layer and the second metal layer. The display panel further includes a first through hole extending through the gate insulating layer and the first insulating layer, and a second through hole extending through the gate insulating layer, the first insulating layer, and the second insulating layer. The source electrode is electrically connected to the source terminal through the first through hole, and the drain electrode is electrically connected to the drain terminal through the second through hole.

Optionally, in some embodiments of the present application, the display panel further includes a first electrode layer disposed on the first metal layer, a fourth insulating layer disposed on the first electrode layer, and a second electrode layer disposed on the fourth insulating layer. One of the first electrode layer and the second electrode layer includes the pixel electrode of the sub-pixel.

Optionally, in some embodiments of the present application, the first electrode layer includes the pixel electrode of the sub-pixel, and the pixel electrode is directly contact-connected to the drain electrode.

Optionally, in some embodiments of the present application, the display panel further includes a third insulating layer disposed between the second insulating layer and the second metal layer. The second insulating layer is made of an organic material, the third insulating layer is made of an inorganic material, and the second through hole further extends through the third insulating layer.

Optionally, in some embodiments of the present application, the display panel further includes a third electrode layer disposed between the second insulating layer and the third insulating layer. The third electrode layer includes plurality of storage electrodes, and the storage electrodes at least partially overlap the pixel electrodes.

Optionally, in some embodiments of the present application, a thickness of the second metal layer is greater than or equal to 3500 angstroms.

Optionally, in some embodiments of the present application, the display panel further includes a first blind hole recessed from each of the first electrode layer, the fourth insulating layer, and the second electrode layer at a position corresponding to the second through hole, and a fifth insulating layer filled at least in the first blind hole and made of an organic material.

Optionally, in some embodiments of the present application, the display panel further includes a color filter substrate including a base substrate and a support column arranged on the base substrate. The support column is located between the base substrate and the substrate, and an orthographic projection of the support column on the substrate and an orthographic projection of the fifth insulating layer on the substrate do not overlap.

Correspondingly, an embodiment of the present application further provides a display terminal, including a display panel, and the display panel including a substrate, a first metal layer disposed on the substrate, and a second metal layer disposed above the first metal layer. The first metal layer includes a plurality of data lines extending in a first direction and thin-film transistors each including a source electrode, the source electrode is electrically connected to a corresponding one of the data lines, the second metal layer includes a drain electrode included in each of the thin-film transistors, and the drain electrode is located between adjacent ones of the data lines.

Optionally, in some embodiments of the present application, the display terminal further includes a third metal layer disposed between the substrate and the first metal layer, and a semiconductor layer disposed between the first metal layer and the substrate. The third metal layer includes a plurality of scan lines extending in a second direction, and the semiconductor layer includes a plurality of active elements of the thin-film transistors. Each of the active elements includes a source terminal, a drain terminal, and an active connecting member connected between the source terminal and the drain terminal, and the first direction is different from the second direction. The source terminal and the drain terminal are located on two sides of a corresponding one of the scan lines, respectively, the active connecting member extends at least in a third direction, and the third direction is different from the first direction and the second direction. The source electrode is electrically connected to the source terminal, and the drain electrode is electrically connected to the drain terminal.

Optionally, in some embodiments of the present application, the thin-film transistor includes a single gate structure.

Optionally, in some embodiments of the present application, the third direction is defined at an angle with respect to the first direction greater than or equal to 5 degrees and less than or equal to 15 degrees.

Optionally, in some embodiments of the present application, the display panel further includes a plurality of sub-pixels. Each of the sub-pixels includes a pixel electrode, the sub-pixels include a first sub-pixel and a second sub-pixel disposed on opposite sides of the scan line, and a gap is located between the pixel electrode of the first sub-pixel and the pixel electrode of the second sub-pixel. The gap is situated corresponding to the scan line.

Optionally, in some embodiments of the present application, the display terminal further includes a gate insulating layer disposed between the semiconductor layer and the third metal layer, a first insulating layer disposed between the third metal layer and the first metal layer, and a second insulating layer disposed between the first metal layer and the second metal layer. The display panel further includes a first through hole extending through the gate insulating layer and the first insulating layer, and a second through hole extending through the gate insulating layer, the first insulating layer, and the second insulating layer. The source electrode is electrically connected to the source terminal through the first through hole, and the drain electrode is electrically connected to the drain terminal through the second through hole.

The present application has advantageous effects as follows: in the embodiments of the present application, the display panel and the display terminal are provided. The display panel includes a substrate, a first metal layer disposed on the substrate, and a second metal layer disposed above the first metal layer. The first metal layer includes a plurality of data lines extending in a first direction and thin-film transistors each including a source electrode. The source electrode is electrically connected to a corresponding one of the data lines. The second metal layer includes a drain electrode included in each of the thin-film transistors, and the drain electrode is located between adjacent ones of the data lines. In the embodiments of the present application, the data line, the source electrode, and the drain electrode are located in the first metal layer and the second metal layer, respectively, and the drain electrode is located between adjacent ones of the data lines. The drain electrode and data lines are disposed in different layers. Compared with conventional drain electrodes and data lines disposed in a same layer, there will be no problem with etching process limitations in the present application, so that a distance between the drain electrode and the data line is reduced, and parasitic capacitance between the drain electrode and the data line is also reduced. The adjacent two data lines can be set closer, and the size of the sub-pixel can become smaller, thereby improving the resolution of the display panel.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described below with reference to the drawings in the embodiments of the present application. Obviously, the described embodiments are only a part of the embodiments of the present application, rather than all the embodiments. Based on the embodiments in this application, all other embodiments obtained by those skilled in the art without creative efforts shall fall within the protection scope of this application. In addition, it should be understood that the specific embodiments described here are only used to illustrate the present application, and are not used to limit the present application. In this application, if no explanation is made to the contrary, the orientation words used, such as "upper" and "lower" usually refer to the upper and lower positions of the device in actual use or working state. Specifically, they refer to the direction of the drawings, and "inner" and "outer" refer to the outline of the device.

An embodiment of the present application provides a display panel, including: a substrate, a first metal layer disposed on the substrate, and a second metal layer disposed above the first metal layer. The first metal layer includes a plurality of data lines extending in a first direction and thin-film transistors each including a source electrode. The source electrode is electrically connected to a corresponding one of the data lines. The second metal layer includes a drain electrode included in each of the thin-film transistors, and the drain electrode is located between adjacent ones of the data lines.

Embodiments of the present application further provide a display terminal including the aforementioned display panel. Detailed descriptions are given below. It should be noted that the description order of the following embodiments is not intended to limit the preferred order of the embodiments.

Embodiment 1

Figure 1:
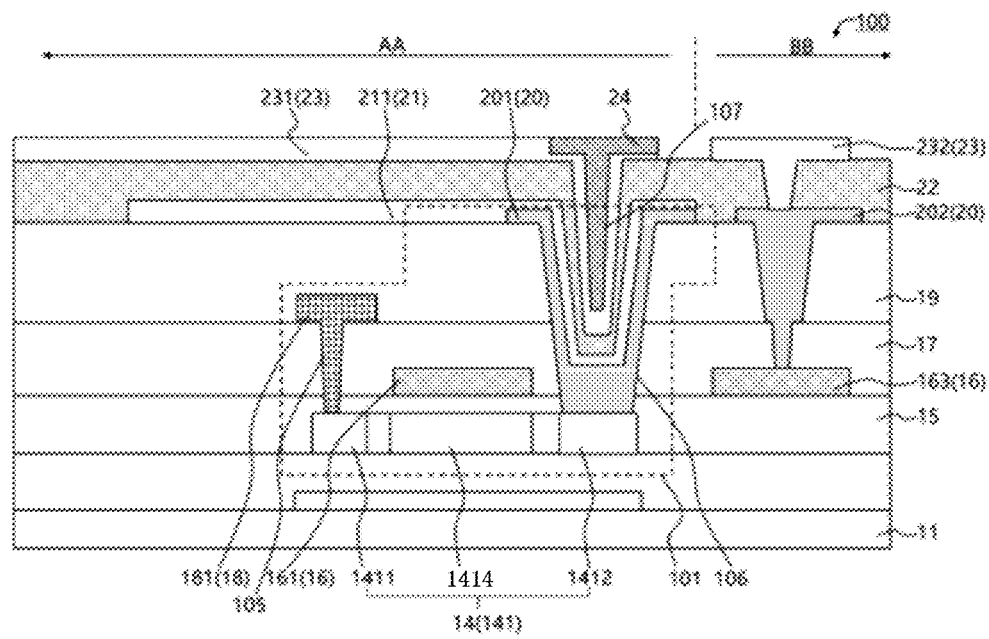
FIG. 1 is a first partial schematic cross-sectional view of a display panel according to an embodiment of the present application.
Figure 2:
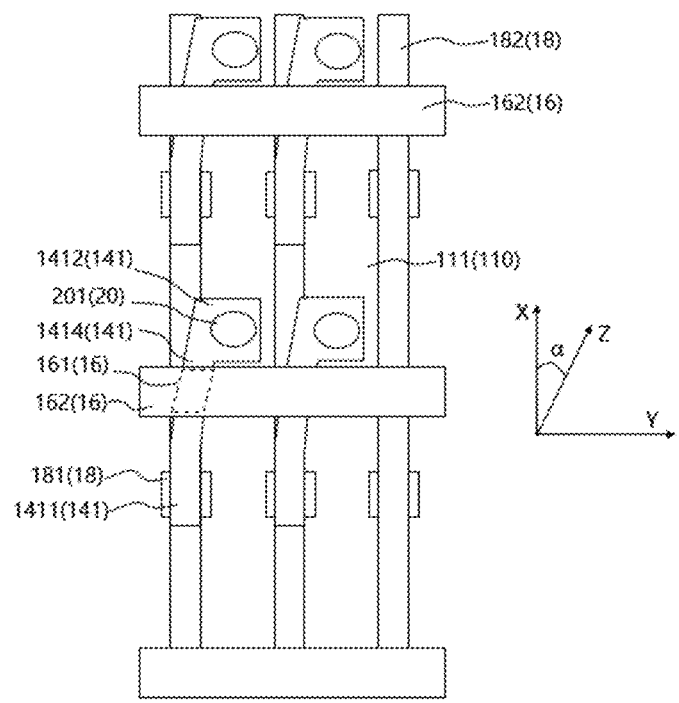
FIG. 2 is a first schematic top plan view of a partial structure of a display panel according to an embodiment of the present application.
Figure 3:
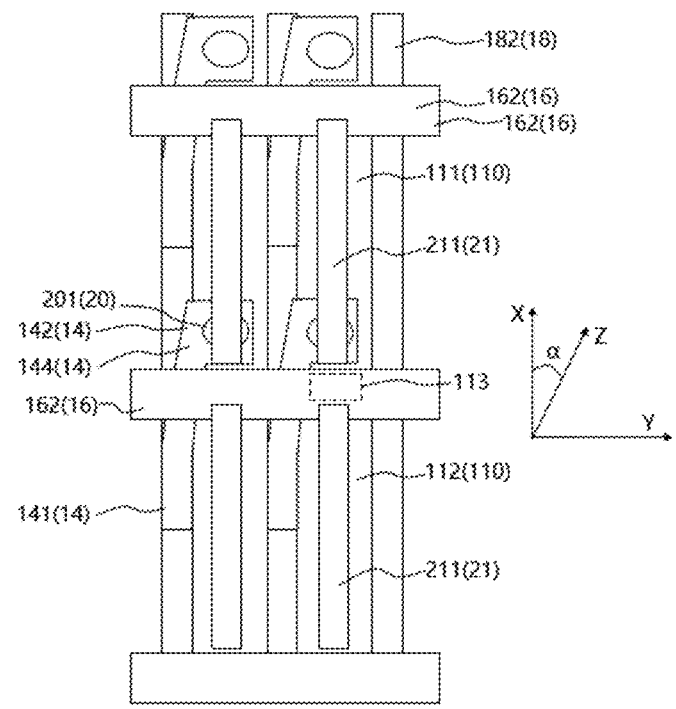
FIG. 3 is a second schematic top plan view of a partial structure of a display panel according to an embodiment of the present application.

Please refer to FIGS. 1, 2, and 3. FIG. 1 is a first partial schematic cross-sectional view of a display panel according to an embodiment of the present application. FIG. 2 is a first schematic top plan view of a partial structure of a display panel according to an embodiment of the present application. FIG. 3 is a second schematic top plan view of a partial structure of a display panel according to an embodiment of the present application. FIGS. 2 and 3 are top plan views of a same part of the display panel. In order to illustrate a structure of the display panel 100 more clearly, FIG. 2 and FIG. 3 selectively show different layer structures.

An embodiment of the present application provides a display panel 100 including a substrate 11, a first metal layer 18, and a second metal layer 20. The first metal layer 18 is disposed on the substrate 11, and the second metal layer 20 is disposed above the first metal layer 18. The first metal layer 18 includes a plurality of data lines 182 extending in a first direction X and thin-film transistors 101 each including a source electrode 181. The source electrode 181 is electrically connected to a corresponding one of the data lines 182. The second metal layer 20 includes a drain electrode 201 included in each of the thin-film transistors 101. The drain electrode 201 is located between adjacent ones of the data lines 182.

Specifically, the display panel 100 includes the substrate 11, the first metal layer 18, and the second metal layer 20. The first metal layer 18 is disposed on the substrate 11, the second metal layer 20 is disposed above the first metal layer 18, and an insulating layer is correspondingly located between the first metal layer 18 and the second metal layer 20, which will be described in detail in subsequent embodiments.

The substrate 11 may be made of a material such as glass, which is not limited herein.

Specifically, the first metal layer 18 includes the data lines 182 extending in the first direction X and the source electrode 181 of the thin-film transistor 101. The source electrode 181 is electrically connected to the data line 182. In FIG. 2, the source electrode 181 is part of the data line 182, but not limited thereto. For example, the source electrode 181 is a protruding part of the data line 182.

Specifically, the source electrode 181 is electrically connected to the data line 182, the second metal layer 20 includes the drain electrode 201 of the thin-film transistor 101, and the drain electrode 201 is located between adjacent two of the data lines 182. The drain electrode 201 and the source electrode 181 are metal layers of different layers.

Specifically, in this embodiment, the data line 182, the source electrode 181, and the drain electrode 201 are located in the first metal layer 18 and the second metal layer 20, respectively. The drain electrode 201 is located between two adjacent ones of the data lines 182, and the drain electrode 201 and the data line 182 are located in different layers. Compared with the prior art in which a drain electrode and a data line are located in a same layer, there is no etching process limitation problem (in the prior art, the drain electrode and the data line are located in the same layer, a large distance needs to be maintained between the drain electrode and the data line electrode to prevent short circuit caused by etching residues, and to prevent excessive parasitic capacitance), so that a distance between the drain electrode 201 and the data line 182 is reduced. Meanwhile, parasitic capacitance between the drain electrode 201 and the data line 182 can be reduced, the adjacent ones of the data lines 182 can be set closer, and a size of a sub-pixel can be made smaller, thereby improving resolution of the display panel 100.

Embodiment 2

This embodiment is the same as or similar to the first embodiment, and the difference lies in that the features of the display panel 100 are further defined. Please refer to FIGS. 1 to 3.

In some embodiments, the display panel 100 further includes a third metal layer 16 and a semiconductor layer 14. The third metal layer 16 is disposed between the substrate 11 and the first metal layer 18. The semiconductor layer 14 is disposed between the first metal layer 18 and the substrate 11. The third metal layer 16 includes a plurality of scan lines 162 extending in a second direction Y. The semiconductor layer 14 includes a plurality of active devices 141 of the thin-film transistors 101. Each of the active devices 141 includes a source terminal 1411, a drain terminal 1412, and an active connecting member 1414 connected between the source terminal 1411 and the drain terminal 1412. The first direction X is different from the second direction Y. The source terminal 1411 and the drain terminal 1412 are located on opposite sides of a corresponding one the scan lines 162, respectively. The active connecting member 1414 extends at least in a third direction Z, which is different from the first direction X and the second direction Y. The source electrode 181 is electrically connected to the source terminal 1411, and the drain electrode 201 is electrically connected to the drain terminal 1412.

Specifically, the first direction X, the second direction Y, and the third direction Z all refer to directions on a same plane, and all refer to directions on a plane parallel to the substrate 11.

Specifically, a material of the semiconductor layer 14 may be polysilicon, but is not limited thereto. It is easy to understand that the active device 141 is a portion of the semiconductor layer 14 corresponding to one thin-film transistor 101. The source terminal 1411 and the drain terminal 1412 are heavily doped regions in the active device 141. The source terminal 1411 is a source region of the active device 141, and the drain terminal 1412 is a drain region of the active device 141.

Specifically, the data lines 182 extend in the first direction X, and the scan lines 162 extend in the second direction Y.

The first direction X is different from the second direction Y, that is, the first direction X intersects the second direction Y. Preferably, or alternatively, the first direction X and the second direction Y are perpendicular to each other.

Specifically, the active device 141 includes the source terminal 1411, the drain terminal 1412, and the active connecting member 1414 connected between the source terminal 1411 and the drain terminal 1412. The source terminal 1411 and the drain terminal 1412 are located on opposite sides of a corresponding scan line 162. The active connecting member 1414 extends at least in the third direction Z. As shown in FIGS. 2 and 3, an orthographic projection of the active connecting member 1414 on the substrate 11 intersects an orthographic projection of the scan line 162 on the substrate, so that the source terminal 1411 and the drain terminal 1412 are located on both sides of the corresponding scan line 162, respectively. Compared with a structure that the source terminal 1411 and the drain terminal 1412 are located on one side of the corresponding scan line 162, a width of the sub-pixel in the first direction X or/and the second direction Y can be reduced in this embodiment, thereby improving the resolution of the display panel.

Specifically, the active connecting member 1414 extends at least in the third direction Z, which is different from the first direction X and the second direction Y. That is, the third direction Z is inclined with respect to the first direction X, and the third direction Z is inclined with respect to the second direction Y.

Specifically, a gate electrode 161 is located at a position where the scan line 162 and the active connecting member 1414 are stacked in a direction perpendicular to the substrate 11, that is, the gate electrode 161 may be part of the scan line 162, but is not limited thereto. For example, the gate electrode 161 may be a protruding part or extending part of the scan line 162.

Specifically, the active connecting member 1414 extends at least in the third direction Z, so that at least part of the drain terminal 1412 is located between the adjacent two of the data lines 182. In this case, the drain electrode 201 located between the two adjacent data lines 182 can still be electrically connected to the drain terminal 1412, thereby improving the resolution of the display panel 100.

In some embodiments, the thin-film transistor 101 includes a single gate structure.

Specifically, the thin-film transistor 101 is a single gate structure type thin-film transistor. The thin-film transistor 101 is provided with only one gate electrode. Compared with a dual-gate structure, a size of the sub-pixel can be made smaller, thereby improving the resolution of the display panel 100.

Specifically, in any of the above-mentioned display panels 100, the thin-film transistor 101 is provided with a single gate structure, that is, the orthographic projection of the active connecting member 1414 on the substrate 11 intersects the orthographic projection of the scan line 162 on the substrate once, so that the width of the sub-pixel in the first direction X or/and the second direction Y is less, thereby improving the resolution of the display panel.

In some embodiments, an angle α between the third direction Z and the first direction X is greater than or equal to 5 degrees and less than or equal to 15 degrees.

Specifically, the included angle α between the third direction Z and the first direction X is set to be greater than or equal to 5 degrees, so that the orthographic projection of the drain terminal 1412 on the substrate 11 and the orthographic projection of the drain electrode 201 on the substrate 11 at least partially overlap, which facilitates electrical connection for the drain electrode 201 to be connected to the drain terminal 1412 through a second through hole 106 described in the subsequent embodiments.

In some embodiments, the angle α between the third direction Z and the first direction X is 7 degrees.

Preferably, the angle α between the third direction Z and the first direction X is 7 degrees, which not only ensure that the active device 141 of the thin-film transistor 101 is provided with a channel with a suitable aspect ratio, but also ensure good electrical connection between the drain electrode 201 and the drain terminal 1412 that is suitable for high-resolution display panels.

In some embodiments, in the display panel 100 of any of the above-mentioned embodiments, the display panel 100 includes a plurality of sub-pixels 110 including a first sub-pixel 111 and a second sub-pixel 112 which are located on opposite sides of the scan line 162, respectively. There is a gap 113 formed between the pixel electrode 211 of the first sub-pixel 111 and the pixel electrode 211 of the second sub-pixel 112, and the gap 113 is located corresponding to the scan line 162.

Specifically, the gap 113 is formed between the pixel electrode 211 of the first sub-pixel 111 and the pixel electrode 211 of the second sub-pixel 112, that is, the pixel electrode 211 of the first sub-pixel 111 and the pixel electrode 211 of the second sub-pixel 112 are disposed corresponding to or are spaced apart from the gap 113. The pixel electrode 211 of the first sub-pixel 111 and the pixel electrode 211 of the second sub-pixel 112 do not need to extend to an opposite side of the corresponding scan line 162, which can reduce a shielding width provided by a black matrix (BM) on a color filter substrate, thereby increasing the aperture ratio and helping improve the resolution of the display panel.

Embodiment 3

This embodiment is the same as or similar to the display panel 100 in any one of the above-mentioned embodiments, and the difference lies in that the features of the display panel 100 are further defined.

Figure 4:
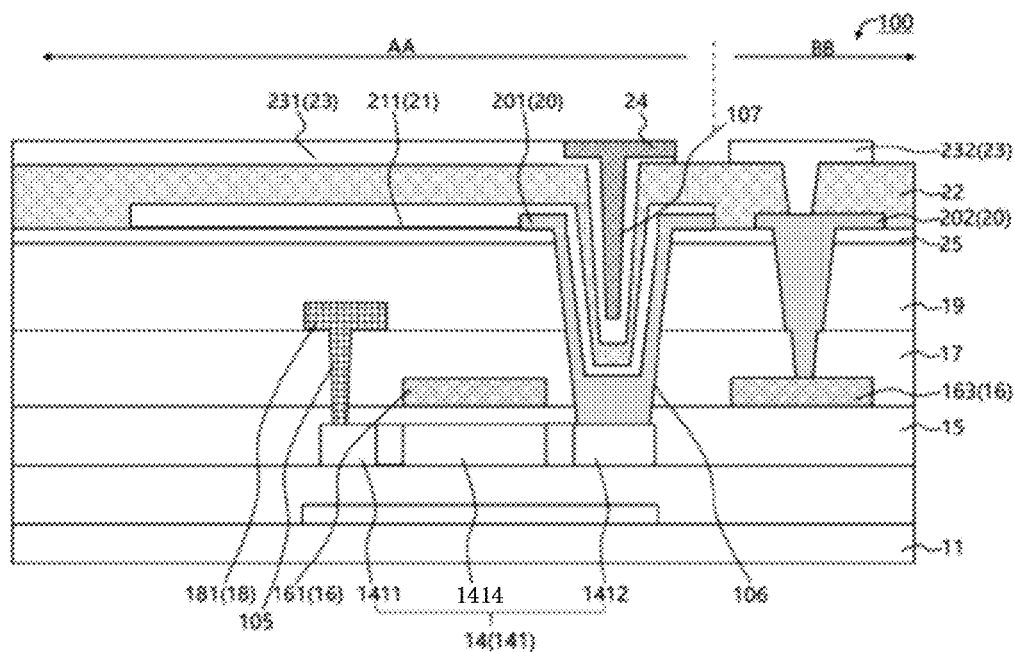
FIG. 4 is a second partial schematic cross-sectional view of a display panel according to an embodiment of the present application.
Figure 5:
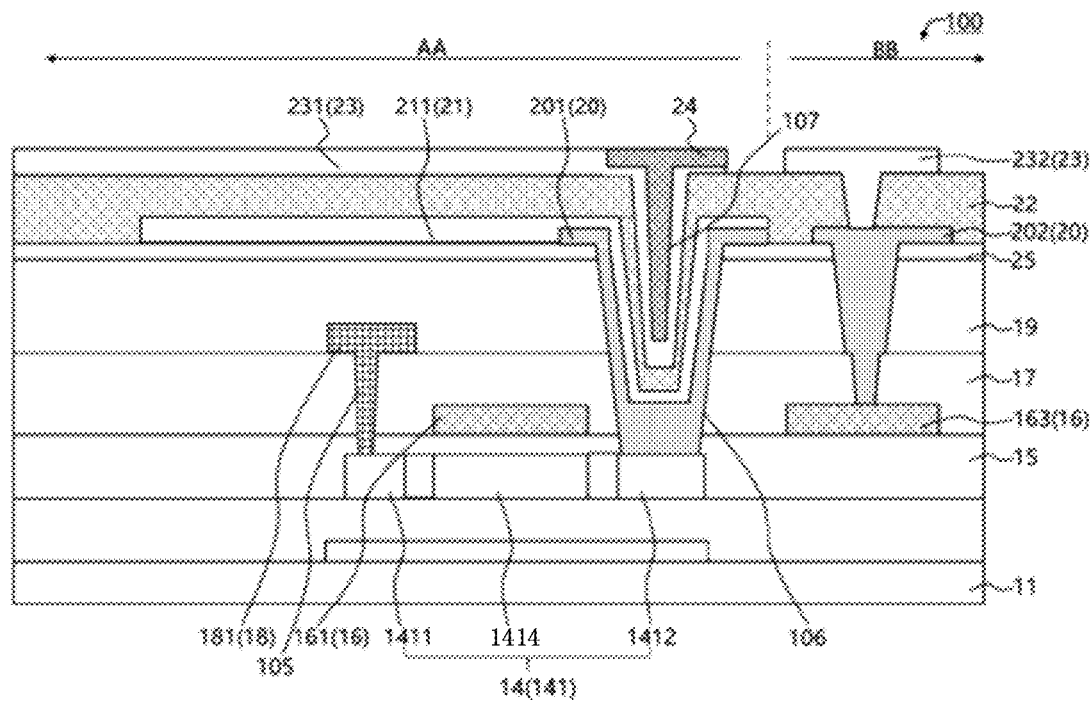
FIG. 5 is a third partial schematic cross-sectional view of a display panel according to an embodiment of the present application.
Figure 6:
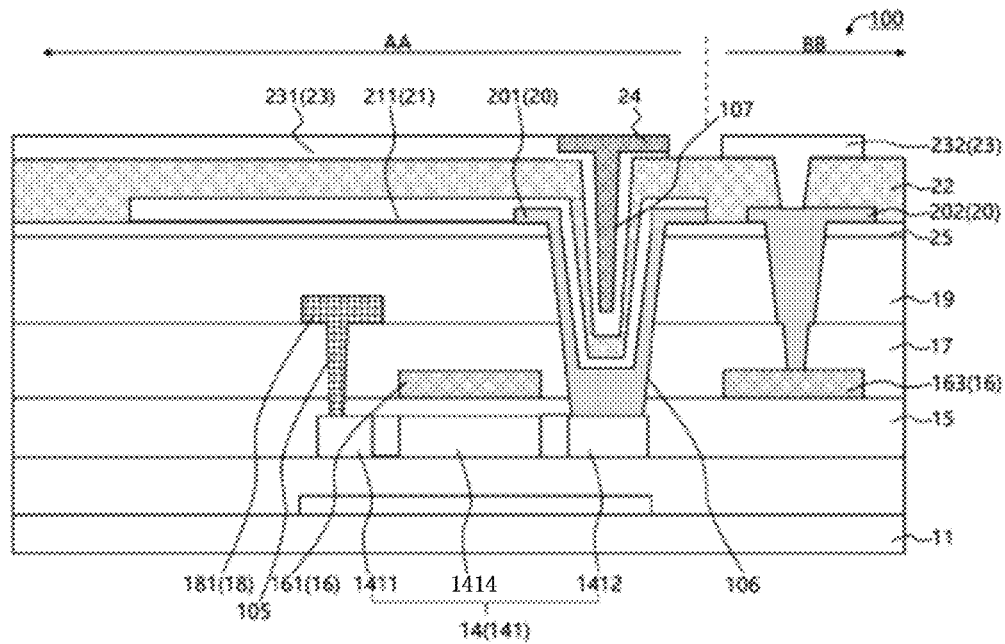
FIG. 6 is a fourth partial schematic cross-sectional view of a display panel according to an embodiment of the present application.

Please refer to FIGS. 1, 4, 5, and 6. FIG. 4 is a second partial schematic cross-sectional view of a display panel according to an embodiment of the present application. FIG. 5 is a third partial schematic cross-sectional view of a display panel according to an embodiment of the present application. FIG. 6 is a fourth partial schematic cross-sectional view of a display panel according to an embodiment of the present application.

In some embodiments, as shown in FIG. 1, the display panel 100 further includes a gate insulating layer 15, a first insulating layer 17, and a second insulating layer 19. The gate insulating layer 15 is disposed between the semiconductor layer 14 and the third metal layer 16. The first insulating layer 17 is disposed between the third metal layer 16 and the first metal layer 18. The second insulating layer 19 is disposed between the first metal layer 18 and the second metal layer 20. The display panel 100 further includes a first through hole 201 extending through the gate insulating layer 15 and the first insulating layer 17, and the second through hole 106 extending through the gate insulating layer 15, the first insulating layer 17, and the second insulating layer 19. The source electrode 181 is electrically connected to the source terminal 1411 through the first through hole 201, and the drain electrode 201 is electrically connected to the drain terminal 1412 through the second through hole 106.

Specifically, the first insulating layer 17 and the second insulating layer 19 may be made of a material including an inorganic material or an organic material. For example, the materials of the first insulating layer 17 and the second insulating layer 19 may include silicon nitride or/and silicon oxide, which is not limited here.

Specifically, the drain electrode 201 is electrically connected to the drain terminal 1412 through the second through hole 106, thereby achieving the electrical connection between the drain electrode 201 and the thin-film transistor 101.

In some embodiments, as shown in FIG. 1, the display panel 100 further includes a first electrode layer 21, a fourth insulating layer 22, and a second electrode layer 23. The first electrode layer 21 is disposed on the first metal layer 18. The fourth insulating layer 22 is disposed on the first electrode layer 21. The second electrode layer 23 is disposed on the fourth insulating layer 22. One of the first electrode layer 21 or the second electrode layer 23 includes the pixel electrode 211 of the sub-pixel 110.

Specifically, when the display panel 100 is a liquid crystal display panel, the first electrode layer 21 may include the pixel electrode 211, and the second electrode layer 23 may include a common electrode 231. Alternatively, when the display panel 100 is a liquid crystal display panel, the first electrode layer 21 may include a common electrode, and the second electrode layer 23 may include a pixel electrode. Both of these cases have advantageous effects of the above embodiments.

In some embodiments, as shown in FIGS. 1, 4, and 5, the first electrode layer 21 includes the pixel electrode 211 of the sub-pixel, and the pixel electrode 211 is directly contact-connected to the drain electrode 201.

Specifically, the first electrode layer 21 includes the pixel electrode 211 of the sub-pixel. The pixel electrode 211 and the drain electrode 201 are in direct contact with each other. In this case, the first electrode layer 21 can be directly fabricated after formation of the second metal layer 20. There is no need to prepare an insulating layer between the first electrode layer 21 and the second metal layer 20, thus simplifying a manufacturing process.

In some embodiments, as shown in FIG. 5, the display panel 100 further includes a third insulating layer 25 disposed between the second insulating layer 19 and the second metal layer 20. The second insulating layer 19 is made of an organic material, the third insulating layer 25 is made of an inorganic material, and the second through hole 106 further extends through the third insulating layer 25.

Specifically, the third insulating layer 25 is disposed between the second insulating layer 19 and the second metal layer 20. the second insulating layer 19 is made of the organic material, and the third insulating layer 25 is made of the inorganic material. In a forming process of the second through hole 106, the third insulating layer 25 and the second insulating layer 19 are etched in a same process, and the third insulating layer 25 can play the role of protecting the second insulating layer 19 and prevent the second insulating layer 19 of the organic material from being overetched, as well as preventing formation of an undercut structure, thus improving connection reliability between the drain electrode 201 and the drain terminal 1412.

In some embodiments, as shown in FIG. 5, the display panel 100 further includes a third electrode layer 26 disposed between the second insulating layer 19 and the third insulating layer 25. The third electrode layer 26 includes a plurality of storage electrodes 261, and the storage electrodes 261 and the pixel electrodes 211 at least partially overlap.

Specifically, each of the storage electrodes 261 at least partially overlaps a corresponding one of the pixel electrodes 211, that is, an orthographic projection of the storage electrode 261 on the substrate 11 at least partially overlaps an orthographic projection of the pixel electrode 211 on the substrate 11.

Specifically, an overlapping area of the pixel electrode 211 and the common electrode in a high-resolution display panel is small, and storage capacitance is not enough. Therefore, the third electrode layer 26 is set to include a plurality of the storage electrodes 261, and the storage electrodes 261 and the pixel electrodes 211 are at least partially overlap, which can increase the storage capacitance in the high-resolution display panel, improve voltage stability of the pixel electrode 211 after charging, and enhance display performance.

In some embodiments, a thickness of the second metal layer 20 is greater than or equal to 3500 angstroms.

Specifically, the second through hole 106 extends through relatively more film layers and is configured with a larger depth. A thickness of the second metal layer 20 is greater than or equal to 3500 angstroms. The second metal layer 20 can fill or fill up the second through hole 106 to a certain extent, so as to provide a relatively flat bearing interface for subsequent film layers such as the pixel electrode 211.

In some embodiments, the display panel 100 further includes a first blind hole 107 and a fifth insulating layer 24. The first blind hole 107 is formed by each of the first electrode layer 21, the fourth insulating layer 22, and the second electrode layer 23 recessed at a position corresponding to the second through hole 106. The fifth insulating layer 24 is filled at least in the first blind hole 107 and is made of an organic material.

Specifically, the first electrode layer 21, the fourth insulating layer 22, and the second electrode layer 23 are relatively thin. The first electrode layer 21, the fourth insulating layer 22, and the second electrode layer 23 are recessed at the position corresponding to the second through holes 202 to form the first blind hole 107. The fifth insulating layer 24 is provided and is made of the organic material. The fifth insulating layer 24 can fill the first blind hole 107. When the display panel 100 is a liquid crystal display panel, a flat interface is provided for a liquid crystal layer 301 disposed on the fifth insulating layer 24, which helps maintain uniformity of cell thickness of the display panel 100.

In some embodiments, as shown in FIG. 6, the display panel 100 further includes a color filter substrate 30. The color filter substrate 30 includes a base substrate 31 and a support column 32 disposed on the base substrate 31. The support column 32 is located between the base substrate 31 and the substrate 11. An orthographic projection of the support column 32 on the substrate 11 does not overlap an orthographic projection of the fifth insulating layer 24 on the substrate 11.

Specifically, since the fifth insulating layer 24 is made of an organic material, a thickness of the fifth insulating layer 24 is provided with a certain volatility. By setting the orthographic projection of the support column 32 on the substrate 11 to not overlap the orthographic projection of the fifth insulating layer 24 on the substrate 11, uneven thickness of a liquid crystal cell of the display panel 100 can be prevented.

It should be noted that, in any one of the display panels 100 in the foregoing embodiments, the display panel 100 may include a display area AA and a non-display area BB, and the non-display area BB is at least partially arranged around the display area AA. The thin-film transistor 101 may be disposed in the display area AA or in the non-display area BB. The third metal layer 16, the first metal layer 18, the second metal layer 20, the first electrode layer 21, the second electrode layer 23, etc. can simultaneously function as wirings, connection electrodes, bridge electrodes, etc., in the non-display area BB. For example, the third metal layer 16 includes a common wiring 163, the second metal layer 20 includes a connection electrode 202, the second electrode layer 23 includes a peripheral common electrode 232, and the peripheral common electrode 232 is electrically connected to the common wiring 163 through the connection electrode 202, which is not limited here.

It should be noted that, in the display panel 100 in any one of the above-mentioned embodiments, when the first through hole 201 is formed, an entire part of the first insulating layer 17 corresponding to the first through hole 201 is etched away, and only a certain portion of part of the first insulating layer 17 corresponding to the second through hole 106 is etched away. A portion of part of the first insulating layer 17 corresponding to the second through hole 106 is reserved to protect the drain terminal 1412. When the second through hole 106 is formed, a reserved part of the first insulating layer 17 and the part of the second insulating layer 19 corresponding to the second through hole 106 are simultaneously etched away. Alternatively, the reserved part of the first insulating layer 17 and the parts of the insulating layer 19 and the third insulating layer 25 corresponding to the second through hole 106 are simultaneously etched away.

Embodiment 4

Figure 7:
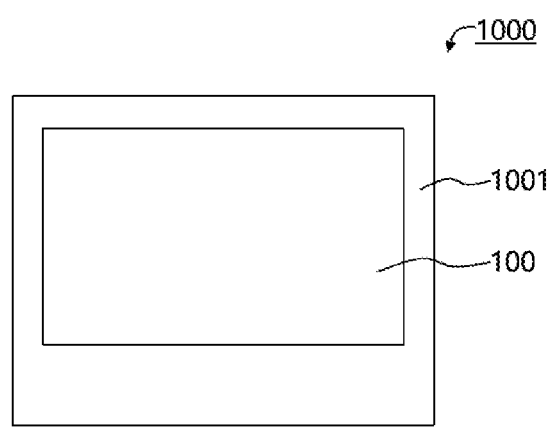
FIG. 7 is a schematic view of a display terminal according to an embodiment of the present application.

Please refer to FIG. 7, which is a schematic view of a display terminal according to an embodiment of the present application.

Embodiments of the present application further provide a display terminal 1000 including the display panel 100 described in any one of the foregoing embodiments.

Specifically, the display terminal 1000 may be a mobile phone, a notebook computer, a television, etc. The display terminal 1000 can also include a terminal body 1001, which is assembled with the display panel 100 into a whole, and the terminal body 1001 may be structures and components such as a casing of the display terminal 1000. The terminal body 1001 may be structures and components such as a casing of the display terminal 1000

The display panel and the display terminal provided in the embodiments of the present application are described in detail above. Specific examples are used in this article to illustrate the principles and implementation of the application, and the descriptions of the above examples are only used to help understand the methods and core ideas of the application; in addition, for those skilled in the art, according to the idea of the application, there will be changes in the specific implementation and the scope of application. In summary, the content of this specification should not be construed as a limitation of the application.

What is claimed is:

1. A display panel, comprising:
a substrate;
a first metal layer disposed on the substrate;
a second metal layer disposed above the first metal layer;
a third metal layer disposed between the substrate and the first metal layer; and
a semiconductor layer disposed between the first metal layer and the substrate;
wherein the first metal layer comprises a plurality of data lines extending in a first direction and thin-film transistors each comprising a source electrode, the source electrode is electrically connected to a corresponding one of the data lines, the second metal layer comprises a drain electrode included in each of the thin-film transistors, and the drain electrode is located between adjacent ones of the data lines;
wherein the third metal layer comprises a plurality scan lines extending in a second direction, and the semiconductor layer comprises a plurality of active elements of the thin-film transistors, wherein each of the active elements comprises a source terminal, a drain terminal, and an active connecting member connected between the source terminal and the drain terminal, and the first direction is different from the second direction;
wherein the source terminal and the drain terminal are located on two sides of a corresponding one of the scan lines, respectively, the active connecting member extends at least in a third direction, and the third direction is different from the first direction and the second direction; and
wherein the source electrode is electrically connected to the source terminal, and the drain electrode is electrically connected to the drain terminal;
wherein the thin-film transistor comprises a single gate structure, and the active connecting member, the scan lines and the data lines are at least partially overlapped.

2. The display panel of claim 1, wherein the third direction is defined at an angle with respect to the first direction greater than or equal to 5 degrees and less than or equal to 15 degrees.

3. The display panel of claim 2, wherein the angle between the third direction and the first direction is 7 degrees.

4. The display panel of claim 1, further comprising a plurality of sub-pixels, wherein each of the sub-pixels comprises a pixel electrode, the sub-pixels comprise a first sub-pixel and a second sub-pixel disposed on opposite sides of the scan line, and a gap is located between the pixel electrode of the first sub-pixel and the pixel electrode of the second sub-pixel, wherein the gap is situated corresponding to the scan line.

5. The display panel of claim 4, further comprising:
a gate insulating layer disposed between the semiconductor layer and the third metal layer;
a first insulating layer disposed between the third metal layer and the first metal layer; and
a second insulating layer disposed between the first metal layer and the second metal layer;
wherein the display panel further comprises a first through hole extending through the gate insulating layer and the first insulating layer, and a second through hole extending through the gate insulating layer, the first insulating layer, and the second insulating layer, wherein the source electrode is electrically connected to the source terminal through the first through hole, and the drain electrode is electrically connected to the drain terminal through the second through hole.

6. The display panel of claim 5, further comprising:
a first electrode layer disposed on the first metal layer;
a fourth insulating layer disposed on the first electrode layer; and
a second electrode layer disposed on the fourth insulating layer;

wherein one of the first electrode layer and the second electrode layer comprises the pixel electrode of the sub-pixel.

7. The display panel of claim 6, wherein the first electrode layer comprises the pixel electrode of the sub-pixel, and the pixel electrode is directly connected to the drain electrode.

8. The display panel of claim 6, further comprising a third insulating layer disposed between the second insulating layer and the second metal layer, wherein the second insulating layer is made of an organic material, the third insulating layer is made of an inorganic material, and the second through hole further extends through the third insulating layer.

9. The display panel of claim 8, further comprising a third electrode layer disposed between the second insulating layer and the third insulating layer, wherein the third electrode layer comprise a plurality of storage electrodes, and the storage electrodes at least partially overlap the pixel electrodes.

10. The display panel of claim 5, wherein a thickness of the second metal layer is greater than or equal to 3500 angstroms.

11. The display panel of claim 6, further comprising a first blind hole recessed from each of the first electrode layer, the fourth insulating layer, and the second electrode layer at a position corresponding to the second through hole, and a fifth insulating layer filled at least in the first blind hole and made of an organic material.

12. The display panel of claim 11, further comprising a color filter substrate comprising a base substrate and a support column arranged on the base substrate, wherein the support column is located between the base substrate and the substrate, and an orthographic projection of the support column on the substrate and an orthographic projection of the fifth insulating layer on the substrate do not overlap.

13. A display terminal, comprising a display panel, wherein the display panel comprises:
a substrate;
a first metal layer disposed on the substrate; and
a second metal layer disposed above the first metal layer;
a third metal layer disposed between the substrate and the first metal layer; and
a semiconductor layer disposed between the first metal layer and the substrate;
wherein the first metal layer comprises a plurality of data lines extending in a first direction and thin-film transistors each comprising a source electrode, the source electrode is electrically connected to a corresponding one of the data lines, the second metal layer comprises a drain electrode included in each of the thin-film transistors, and the drain electrode is located between adjacent ones of the data lines;
wherein the third metal layer comprises a plurality scan lines extending in a second direction, and the semiconductor layer comprises a plurality of active elements of the thin-film transistors, wherein each of the active elements comprises a source terminal, a drain terminal, and an active connecting member connected between the source terminal and the drain terminal, and the first direction is different from the second direction;
wherein the source terminal and the drain terminal are located on two sides of a corresponding one of the scan lines, respectively, the active connecting member extends at least in a third direction, and the third direction is different from the first direction and the second direction; and
wherein the source electrode is electrically connected to the source terminal, and the drain electrode is electrically connected to the drain terminal;
wherein the thin-film transistor comprises a single gate structure, and the active connecting member, the scan lines and the data lines are at least partially overlapped.

14. The display terminal of claim 13, wherein the third direction is defined at an angle with respect to the first direction greater than or equal to 5 degrees and less than or equal to 15 degrees.

15. The display terminal of claim 4, wherein the display panel further comprises a plurality of sub-pixels, wherein each of the sub-pixels comprises a pixel electrode, the sub-pixels comprise a first sub-pixel and a second sub-pixel disposed on opposite sides of the scan line, and a gap is located between the pixel electrode of the first sub-pixel and the pixel electrode of the second sub-pixel, wherein the gap is situated corresponding to the scan line.

16. The display terminal of claim 15, further comprising:
a gate insulating layer disposed between the semiconductor layer and the third metal layer;
a first insulating layer disposed between the third metal layer and the first metal layer; and
a second insulating layer disposed between the first metal layer and the second metal layer;
wherein the display panel further comprises a first through hole extending through the gate insulating layer and the first insulating layer, and a second through hole extending through the gate insulating layer, the first insulating layer, and the second insulating layer, wherein the source electrode is electrically connected to the source terminal through the first through hole, and the drain electrode is electrically connected to the drain terminal through the second through hole.

17. The display terminal of claim 16, further comprising:
a first electrode layer disposed on the first metal layer;
a fourth insulating layer disposed on the first electrode layer; and
a second electrode layer disposed on the fourth insulating layer;
wherein one of the first electrode layer and the second electrode layer comprises the pixel electrode of the sub-pixel.

18. The display panel of claim 17, wherein the first electrode layer comprises the pixel electrode of the sub-pixel, and the pixel electrode is directly connected to the drain electrode.

19. The display panel of claim 17, further comprising a third insulating layer disposed between the second insulating layer and the second metal layer, wherein the second insulating layer is made of an organic material, the third insulating layer is made of an inorganic material, and the second through hole further extends through the third insulating layer.

20. The display panel of claim 19, further comprising a third electrode layer disposed between the second insulating layer and the third insulating layer, wherein the third electrode layer comprise a plurality of storage electrodes, and the storage electrodes at least partially overlap the pixel electrodes.

* * * * *